(12) United States Patent
Han et al.

(10) Patent No.: US 12,507,549 B2
(45) Date of Patent: Dec. 23, 2025

(54) DISPLAY PANEL AND DISPLAY DEVICE

(71) Applicant: LG DISPLAY CO., LTD., Seoul (KR)

(72) Inventors: Sungman Han, Gyeonggi-do (KR); Dojin Kim, Seoul (KR); Seongkwang Kim, Gyeonggi-do (KR)

(73) Assignee: LG Display Co., Ltd. (KR)

( * ) Notice: Subject to any disclaimer, the term of this patent is extended or adjusted under 35 U.S.C. 154(b) by 645 days.

(21) Appl. No.: 17/981,355

(22) Filed: Nov. 4, 2022

(65) Prior Publication Data

US 2023/0217747 A1 Jul. 6, 2023

(30) Foreign Application Priority Data

Dec. 31, 2021 (KR) .................. 10-2021-0194679

(51) Int. Cl.
*H10K 59/131* (2023.01)
*H10K 59/122* (2023.01)
*H10K 59/126* (2023.01)
*H10K 71/00* (2023.01)

(52) U.S. Cl.
CPC ......... *H10K 59/131* (2023.02); *H10K 59/122* (2023.02); *H10K 71/861* (2023.02); *H10K 59/126* (2023.02)

(58) Field of Classification Search
CPC .. H10K 59/131; H10K 59/126; H10K 59/123; H10K 59/122; H10K 71/861; H10D 86/443; H10D 86/441
See application file for complete search history.

(56) References Cited

U.S. PATENT DOCUMENTS

| | | | | |
|---|---|---|---|---|
| 2017/0345846 | A1* | 11/2017 | Yang | H10K 59/1213 |
| 2018/0151661 | A1* | 5/2018 | Oh | H10D 86/40 |
| 2022/0165837 | A1* | 5/2022 | Park | H10K 59/131 |

* cited by examiner

*Primary Examiner* — Jose R Diaz
(74) *Attorney, Agent, or Firm* — Fish & Richardson P.C.

(57) ABSTRACT

A display panel for a display device includes a substrate, a light blocking layer disposed over the substrate, a signal line disposed over the substrate, overlapping with a portion of the light blocking layer, and having at least one branched portion, at least one protection pattern overlapping with a portion of the branched portion of the signal line, a pixel electrode disposed over the protection pattern, a light emitting layer disposed over the pixel electrode, and a common electrode disposed over the light emitting layer, wherein the branched portion of the signal line includes an area not overlapping with the light blocking layer, and wherein in the area not overlapping with the light blocking layer, the branched portion overlaps with the protection pattern, thereby preventing damage to the electrodes of the light emitting element due to a laser beam during the repair of the signal line.

20 Claims, 8 Drawing Sheets

DISPLAY PANEL AND DISPLAY DEVICE

CROSS-REFERENCE TO RELATED APPLICATION

This application claims priority from Korean Patent Application No. 10-2021-0194679, filed over Dec. 31, 2021, which is hereby incorporated by reference in its entirety.

BACKGROUND

Field of the Disclosure

The present disclosure relates to a display panel and a display device.

Description of the Background

During the manufacture of a display panel, defects, such as bright spots or dark spots, may occur in various positions of the subpixels for various reasons, e.g., foreign bodies. For example, a foreign material buildup may occur between the anode electrode and cathode electrode in the light emitting element of each subpixel. If so, the light emitting element fails to emit light, so that the subpixel may become a dark spot.

In conventional display industry, if a failure occurs due to a foreign material over a signal line during the panel manufacturing process, the defective portion is disconnected by radiating laser beams to the signal line. However, such a repair method may damage other conductive layers disposed over the signal line.

SUMMARY

Accordingly, the present disclosure is to provide a display panel and display device capable of increasing the emission area while preventing damage to other conductive layers in the display device upon repairing a signal line.

More specifically, the present disclosure is to provide a display panel and display device capable of preventing damage to the electrodes of a light emitting element due to the laser beam upon repairing a signal line by disposing at least one protection pattern between the separated portion of the signal line and the light emitting element.

The present disclosure is also to a display panel and display device having a structure capable of increasing the emission area by disposing the separated portion of a signal line, which is a component for repair, in the emission area through at least one protection pattern.

The present disclosure is also to a display panel and display device having a structure capable of reducing parasitic capacitance between a signal line and a pixel electrode by disposing a floated protection pattern between the signal line and the pixel electrode.

In an aspect of the present disclosure, a display device includes a substrate, a light blocking layer disposed over the substrate, a signal line disposed over the substrate, overlapping with a portion of the light blocking layer, and having at least one branched portion, at least one protection pattern overlapping with a portion of the branched portion of the signal line, a pixel electrode disposed over the protection pattern, a light emitting layer disposed over the pixel electrode, and a common electrode disposed over the light emitting layer, wherein the branched portion of the signal line includes at least a part of an area not overlapping with the light blocking layer, and wherein in the area not overlapping with the light blocking layer, at least a part of the branched portion overlaps with the protection pattern, thereby preventing damage to the electrodes of the light emitting element due to a laser beam during the repair of the signal line.

In another aspect of the present disclosure, a display panel includes a substrate including an emission area and a non-emission area surrounding the emission area, a signal line disposed over the substrate, overlapping with a portion of the light blocking layer, and having at least one branched portion, at least one protection pattern overlapping with a portion of the branched portion of the signal line, a pixel electrode disposed over the protection pattern, a light emitting layer disposed over the pixel electrode, and a common electrode disposed over the light emitting layer, wherein the at least one protection pattern is disposed in the emission area.

Various aspects of the present disclosure provide a display panel and display device capable of preventing damage to the electrodes of a light emitting element due to the laser beam upon repairing a signal line by disposing at least one protection pattern between the separated portion of the signal line and the light emitting element.

Various aspects of the present disclosure provide a display panel and display device having a structure capable of increasing the emission area by disposing the separated portion of a signal line, which is a component for repair, in the emission area through at least one protection pattern.

Various aspects of the present disclosure provide a display panel and display device having a structure capable of reducing parasitic capacitance between a signal line and a pixel electrode while enhancing driving reliability by preventing or blocking a parasitic capacitance between the signal line and the pixel electrode by disposing a floated protection pattern between pixel electrodes.

BRIEF DESCRIPTION OF THE DRAWINGS

The above and other features and advantages of the present disclosure will be more clearly understood from the following detailed description, taken in conjunction with the accompanying drawings, in which.

DETAILED DESCRIPTION

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various aspects of the present disclosure are described in detail with reference to the accompanying drawings.

Figure 1:
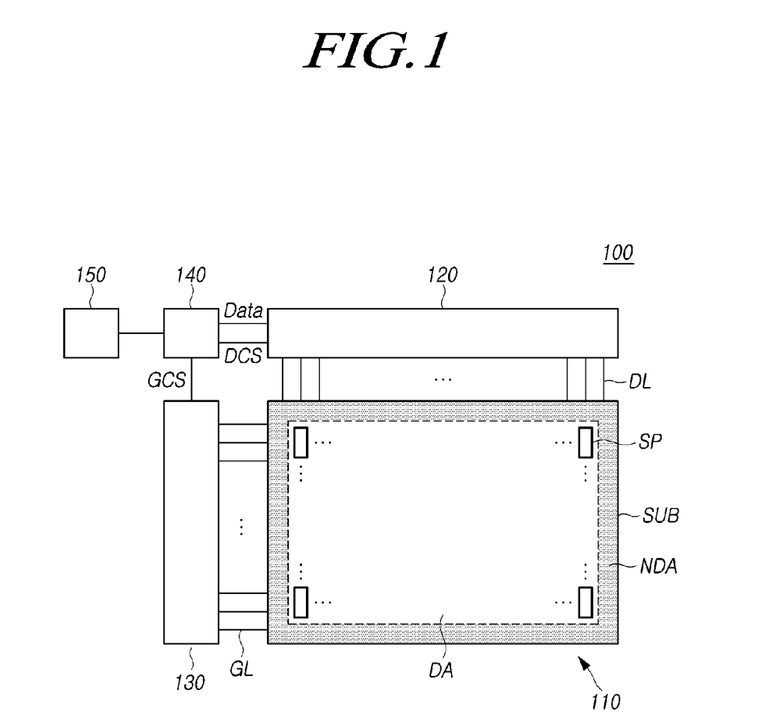
FIG. 1 is a view illustrating a system configuration of a display device according to aspects of the present disclosure.

FIG. 1 is a view illustrating a system configuration of a display device 100 according to aspects of the present disclosure. Referring to FIG. 1, a display driving system of a display device 100 according to aspects of the present disclosure may include a display panel 110 and display driving circuits for driving the display panel 110.

The display panel 110 may include a display area DA in which images are displayed and a non-display area NDA in which no image is displayed. The display panel 110 may include a plurality of subpixels SP disposed over a substrate SUB for image display. For example, the plurality of subpixels SP may be disposed in the display area DA. In some cases, at least one subpixel SP may be disposed in the non-display area NDA. At least one subpixel SP disposed in the non-display area NDA is also referred to as a dummy subpixel.

The display panel 110 may include a plurality of signal lines disposed over the substrate SUB to drive the plurality of subpixels SP. For example, the plurality of signal lines may include data lines DL, gate lines GL, driving voltage lines, and the like.

The plurality of data lines DL and the plurality of gate lines GL may cross each other. Each of the plurality of data lines DL may be disposed while extending in a first direction. Each of the plurality of gate lines GL may be disposed while extending in a direction crossing the first direction. Here, the first direction may be a column direction and the direction crossing the first direction may be a row direction.

The display driving circuits may include a data driving circuit 120, a gate driving circuit 130, and a controller 140 controlling the data driving circuit 120 and the gate driving circuit 130. The data driving circuit 120 may output data signals (also referred to as data voltages) corresponding to an image signal to the plurality of data lines DL. The gate driving circuit 130 may generate gate signals and output the gate signals to the plurality of gate lines GL. The controller 140 may convert the input image data input from an external host 150 to meet the data signal format used in the data driving circuit 120 and supply the converted image data to the data driving circuit 120.

The data driving circuit 120 may include one or more source driver integrated circuits. For example, each source driver integrated circuit may be connected with the display panel 110 by a tape automated bonding (TAB) method or connected to a bonding pad of the display panel 110 by a chip over glass (COG) or chip over panel (COP) method or may be implemented by a chip over film (COF) method and connected with the display panel 110.

The gate driving circuit 130 may be connected to the display panel 110 by a tape automatic bonding (TAB) method, connected to a bonding pad of the display panel 110 by a COG or COP method, connected to the display panel 110 by a COF method, or may be formed in the non-display area NDA of the display panel 110 by a gate in panel (GIP) method.

The display device 100 according to aspects of the present disclosure may be a self-emission display device in which the display panel 110 emits light by itself. For example, the display device 100 according to aspects of the present disclosure may be an organic light emitting diode display in which the light emitting element is implemented as an organic light emitting diode (OLED). As another example, the display device 100 according to aspects of the present disclosure may be an inorganic light emitting display device in which the light emitting element is implemented as an inorganic material-based light emitting diode. As another example, the display device 100 according to aspects of the present disclosure may be a quantum dot display device in which the light emitting element is implemented as a quantum dot which is self-emission semiconductor crystal.

Figure 2:
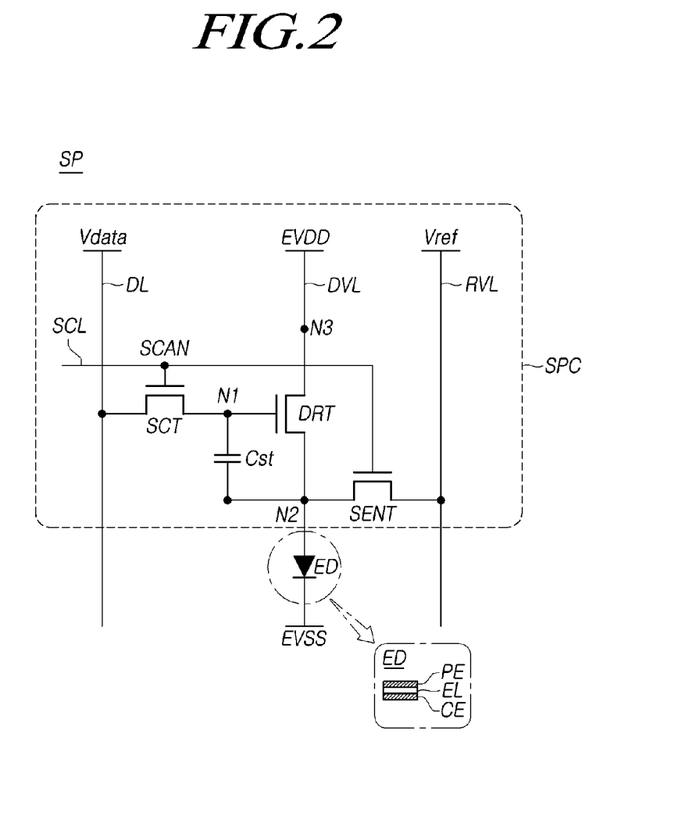
FIG. 2 is an equivalent circuit diagram illustrating a subpixel SP of a display device according to aspects of the present disclosure.

FIG. 2 is an equivalent circuit diagram illustrating a subpixel SP of a display device 100 according to aspects of the present disclosure. Referring to FIG. 2, in the display device 100 according to aspects of the present disclosure, each subpixel SP may include a light emitting element ED and a pixel driving circuit SPC for driving the light emitting element ED. The pixel driving circuit SPC may include a driving transistor DRT, a scan transistor SCT, and a storage capacitor Cst.

The driving transistor DRT may control a current flowing to the light emitting element ED to drive the light emitting element ED. The scan transistor SCT may transfer the data voltage Vdata to the first node N1 which is the gate node of the driving transistor DRT. The storage capacitor Cst may be configured to maintain a voltage for a predetermined period of time.

The light emitting element ED may include a pixel electrode PE and a common electrode CE, and a light emitting layer EL positioned between the pixel electrode PE and the common electrode CE. The pixel electrode PE may be an anode electrode (or a cathode electrode) and may be electrically connected to the second node N2 of the driving transistor DRT. The common electrode CE may be a cathode electrode (or an anode electrode), and a ground voltage EVSS may be applied thereto. The light emitting element ED may be, e.g., an organic light emitting diode OLED, an inorganic material-based light emitting diode LED, or a quantum dot light emitting element.

The driving transistor DRT is a transistor for driving the light emitting element ED, and may include a first node N1, a second node N2, and a third node N3. The first node N1 is a gate node and may be electrically connected to the source node or drain node of the scan transistor SCT. The second node N2 may be a source node or a drain node, and may be electrically connected to the anode electrode PE of the light emitting element ED. The third node N3 may be a drain node or a source node, and may be electrically connected to a driving voltage line DVL that supplies the driving voltage EVDD. For convenience of description, in the example described below, the second node N2 may be a source node and the third node N3 may be a drain node.

The scan transistor SCT may switch the connection between the data line DL and the first node N1 of the driving transistor DRT. In response to the scan signal SCAN supplied from the scan line SCL which is a kind of the gate line GL, the scan transistor SCT may control connection between the first node N1 of the driving transistor DRT and a corresponding data line DL among the plurality of data lines DL.

The drain node or source node of the scan transistor SCT may be electrically connected to a corresponding data line DL. The source node or drain node of the scan transistor SCT may be electrically connected to the first node N1 of the driving transistor DRT. The gate node of the scan transistor SCT may be electrically connected to the scan line SCL to receive the scan signal SCAN. The scan transistor SCT may be turned over by the scan signal SCAN of a turn-on level voltage and transfer the data voltage Vdata supplied from the data line DL to the first node N1 of the driving transistor DRT.

The storage capacitor Cst may be configured between the first node N1 and second node N2 of the driving transistor DRT.

Referring to FIG. 2, in the display device 100 according to aspects of the present disclosure, the pixel driving circuit SPC of each subpixel SP may further include a sensing transistor SENT. The sensing transistor SENT may switch the connection between the second node N2 of the driving transistor DRT and the reference voltage line RVL to which the reference voltage Vref is applied.

In response to the scan signal SCAN supplied from the scan line SCL, the sensing transistor SENT may control connection between the second node N2 of the driving transistor DRT electrically connected to the pixel electrode PE of the light emitting element ED and a corresponding reference voltage line RVL among the plurality of reference voltage lines RVL. In FIG. 2, the gate node of the sensing transistor SENT and the gate node of the scan transistor SCT are connected to the same scan line SCL, but this is merely an example for convenience of description, and they may be connected to different scan lines SCL.

The drain node or source node of the sensing transistor SENT may be electrically connected to the reference voltage line RVL. The source node or drain node of the sensing transistor SENT may be electrically connected to the second node N2 of the driving transistor DRT and may be electrically connected to the pixel electrode PE of the light emitting element ED. The gate node of the sensing transistor SENT may be electrically connected to the scan line SCL to receive the scan signal SCAN.

Each of the driving transistor DRT, the scan transistor SCT, and the sensing transistor SENT may be an n-type transistor or a p-type transistor.

The 3T1C structure of the subpixel SP illustrated in FIG. 2 is merely an example for description purposes, and the subpixel SP may include only two transistors and one capacitor or may further include one or more transistors, or further include one or more capacitors. The plurality of subpixels SP may have the same structure, or some of the plurality of subpixels SP may have a different structure.

The display device 100 according to aspects of the present disclosure may have a top emission structure or a bottom emission structure. The top emission structure is described below as an example.

Figure 3:
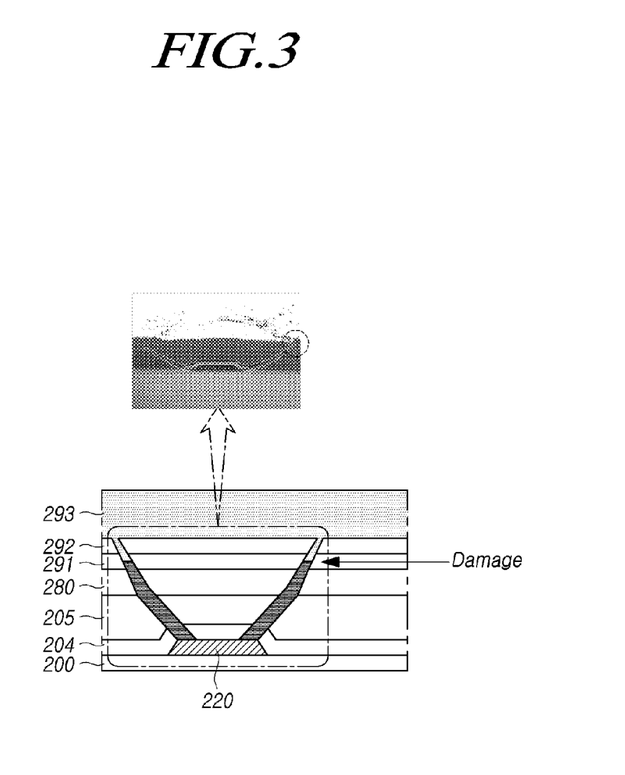
FIG. 3 is a view illustrating a state in which a signal line has been cut to repair a defective subpixel in a display device according to aspects of the present disclosure.

FIG. 3 is a view illustrating a state in which a signal line has been cut to repair a defective subpixel in a display device according to aspects of the present disclosure.

Referring to FIG. 3, a display device according to aspects of the present disclosure may include a substrate 200, a signal line 220, a plurality of insulation films 204 and 205, a bank 280, a light emitting layer 291, a cathode electrode 292, and a conductive encapsulation film 293.

In the patterning process for forming the signal line 220, a foreign material existing over the signal line 220 may remain without being removed.

The foreign material causes an electrical connection between the signal line 220 and another conductive layer (e.g., the source electrode, drain electrode, pixel electrode, or common electrode) disposed over the signal line 220, causing a dark spot in the subpixel SP having the foreign material.

To repair the signal line 220 of the subpixel SP with the dark spot, a process of cutting a portion of the signal line 220 with a laser beam may be performed.

During the process of cutting the signal line 220 with the foreign material by the laser beam, damage, such as cracks, may also occur in the conductive layer (e.g., pixel electrode or common electrode) disposed over the signal line 220. In this case, the damaged conductive layer and another conductive layer (e.g., conductive encapsulation film) may come into contact with each other, causing a dark spot in the corresponding subpixel SP.

The subpixel SP where a dark spot occurs as the signal line 220 and another conductive layer are shorted or different conductive layers, which are supposed to be spaced apart, contact each other due to a foreign material present over the signal line 220 may be referred to as a band subpixel SP.

Aspects of the present disclosure may prevent a dark spot or a bad subpixel through the signal line 220 and a protection pattern.

Figure 4:
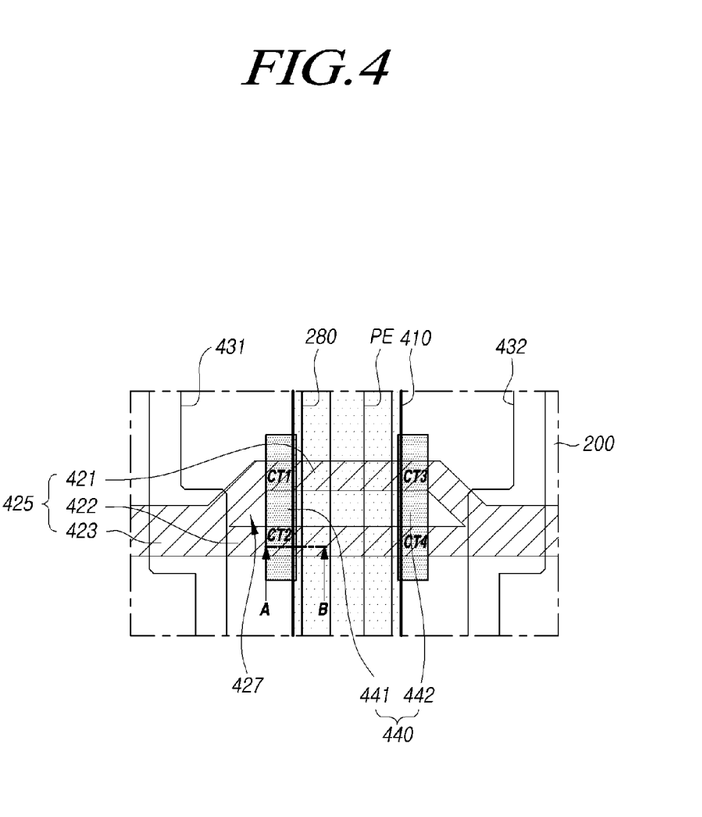
FIG. 4 is a view illustrating a structure of a subpixel without damage to a conductive layer during the process of repairing a defective subpixel in a display device according to aspects of the present disclosure.

FIG. 4 is a view illustrating a structure of a subpixel without damage to a conductive layer during the process of repairing a defective subpixel in a display device according to aspects of the present disclosure.

Referring to FIG. 4, a subpixel SP of a display device 100 according to aspects of the present disclosure may include a light blocking layer 410, at least one signal line 220, a plurality of active layers 431 and 432, at least one auxiliary pattern 440, a pixel electrode PE, and a bank 280.

Referring to FIG. 4, the light blocking layer 410 may be disposed over the substrate 200.

At least one signal line 220 may be disposed over the substrate 200 over which the light blocking layer 410 is disposed.

A portion of the signal line 220 may overlap with a portion of the light blocking layer 410.

The light blocking layer 410 and the signal line 220 may include a metal material.

At least one signal line 220 may extend in one direction. The signal line 220 may be a scan line, but aspects of the present disclosure are not limited thereto.

The signal line 220 may include a branched portion 425 including at least one hole 427.

One signal line 220 may include a first portion 421, a second portion 422, and a third portion 423.

The first portion 421 and the second portion 422 may be branched portions with the hole 427 interposed therebetween. Two opposite ends of the first portion 421 and the second portion 422 may be formed integrally with each other.

An area in which the signal line 220 is not branched into the first portion 421 and the second portion 422 may be a third portion 423 of the signal line 220.

When a foreign material is present over the first portion 421 or the second portion 422 of the signal line 220, the signal line 220 may be electrically connected with another conductive layer disposed over the signal line 220 due to the foreign material. However, although the portion of the signal line 220 with the foreign material is cut by a laser beam, another portion may remain integrated with the third portion 423.

For example, when a foreign material is present over the first portion 421 of the signal line 220, the first portion 421 may be cut by a laser beam to prevent a defect in the corresponding subpixel SP.

Accordingly, it may be difficult for the first portion 421 to receive a signal from the third portion 423.

In contrast, since the second portion 422 remains integrally formed with the third portion 423, the second portion 422 may receive the signal supplied from the third portion 423, so that the corresponding subpixel SP may easily be driven thereby.

In other words, in the display device 100 according to aspects of the present disclosure, as the signal line 220 includes the first portion 421 and the second portion 422, although a foreign material is present over the signal line 220, the subpixel SP may be normally operated after repair.

The light blocking layer 410 may overlap with a portion of the first portion 421 and the second portion 422 of the signal line 220 and a portion of the hole 427 of the signal line 220.

Referring to FIG. 4, the subpixel SP may include the active layers 431 and 432 overlapping with a portion of the signal line 220. The active layers 431 and 432 may be disposed over a layer between the light blocking layer 410 and the signal line 220.

The active layers 431 and 432 may overlap with a portion of the signal line 220 while not overlapping with the branched portion 425 of the signal line 220.

Referring to FIG. 4, at least one protection pattern 440 may be disposed over the signal line 220.

For example, the protection pattern 440 may include a first protection pattern 441 and a second protection pattern 442 that are spaced apart from each other.

Each of the first protection pattern 441 and the second protection pattern 442 may include a metal material.

The protection pattern 440 including the first protection pattern 441 and the second protection pattern 442 may be in a floating state. In other words, there may be no component electrically connected with the protection pattern 440 in the subpixel SP.

The pixel electrode PE of the light emitting element may be disposed over the substrate 200 over which the protection pattern 440 is disposed.

In a plan view, the first protection pattern 441 and the second protection pattern 442, overlapping with at least a part of the same separated portion 425, respectively may overlap with at least a part of the pixel electrodes PE disposed in different subpixels SP. In other words, the first protection pattern 441 and the second protection pattern 442 overlapping with at least a part of the same separated portion 425 may overlap with at least a part of different pixel electrodes PE.

The pixel electrode PE may include a reflective metal.

A bank 280 overlapping with the pixel electrode PE may be disposed over the pixel electrode PE.

Although not shown in FIG. 4, the first protection pattern 441 and the second protection pattern 442 may be disposed over the same layer as different signal lines disposed to cross the source electrode and drain electrode of the transistor disposed in the subpixel SP or the signal line 220.

A portion of each of the first protection pattern 441 and the second protection pattern 442 may overlap with a portion of the branched portion 425 of the signal line 220.

For example, as illustrated in FIG. 4, a portion of each of the first protection pattern 441 and the second protection pattern 442 may overlap with a portion of the first portion 421, a portion of the second portion 422, and a portion of the hole 427 of the signal line 220.

A portion of each of the first protection pattern 441 and the second protection pattern 442 may overlap with at least a part of the light blocking layer 410, and a remaining portion may not overlap with the light blocking layer 410. In the area where the first protection pattern 441 and the second protection pattern 442 do not overlap with at least a part of the light blocking layer 410, the first protection pattern 441 and the second protection pattern 442 may overlap with at least one of the first portion 421 and the second portion 442 of the signal line 220.

Referring to FIG. 4, the area where the first portion 421 of the signal line 220 and the first protection pattern 441 overlap with may be at least a part of a first cutting point CT1, and the area where the second portion 421 of the signal line 220 and the first protection pattern 441 overlap with may be at least a part of a second cutting point CT2.

The area where the first portion 421 of the signal line 220 and the second protection pattern 442 overlap with may be at least a part of a third cutting point CT3, and the area where the second portion 422 of the signal line 220 and the second protection pattern 442 overlap with may be at least a part of a fourth cutting point CT4.

When a foreign material is present over the signal line 220, in particular, when a foreign material is present over the first portion 421 or the second portion 422 of the signal line 220, a laser beam may be radiated to at least one cutting point among the first to fourth cutting points CT1, CT2, CT3, and CT4.

When the laser beam is radiated to at least one of the first to fourth cutting points CT1, CT2, CT3, and CT4, the signal line 220 is cut in the laser-radiated area, and the remaining laser beam may not pass through the protection pattern 440.

Thus, the laser beam may not reach other conductive layers (e.g., the pixel electrode or common electrode) disposed over the protection pattern 440, reducing or preventing damage to the other conductive layers.

Referring to FIG. 4, a portion of the pixel electrode PE may overlap with a portion of the signal line 220.

At least a part of the pixel electrode PE may not overlap with a portion of the first portion 421 and a portion of the second portion 422 of the signal line 220 and may not overlap with a portion of the hole 427 of the signal line 220.

A portion of the pixel electrode PE may not overlap with the light blocking layer 410. In the area where at least a part of the pixel electrode PE does not overlap with the light blocking layer 410, at least a part of the pixel electrode PE may overlap with the protection pattern 440 and the signal line 220.

A laser beam for repairing the signal line 220 may be radiated to the area where at least a part of the pixel electrode PE does not overlap with the light blocking layer 410 but overlaps with the protection pattern 440 and the signal line 220, and the protection pattern 440, disposed under the pixel electrode PE, may block the laser beam, preventing damage to the pixel electrode PE by the laser beam.

Further, the common electrode, disposed over the pixel electrode PE, may also be prevented by the protection pattern 440 from damage due to the laser beam during the repair of the signal line 220.

This is described below in detail with reference to FIG. 5.

Figure 5:
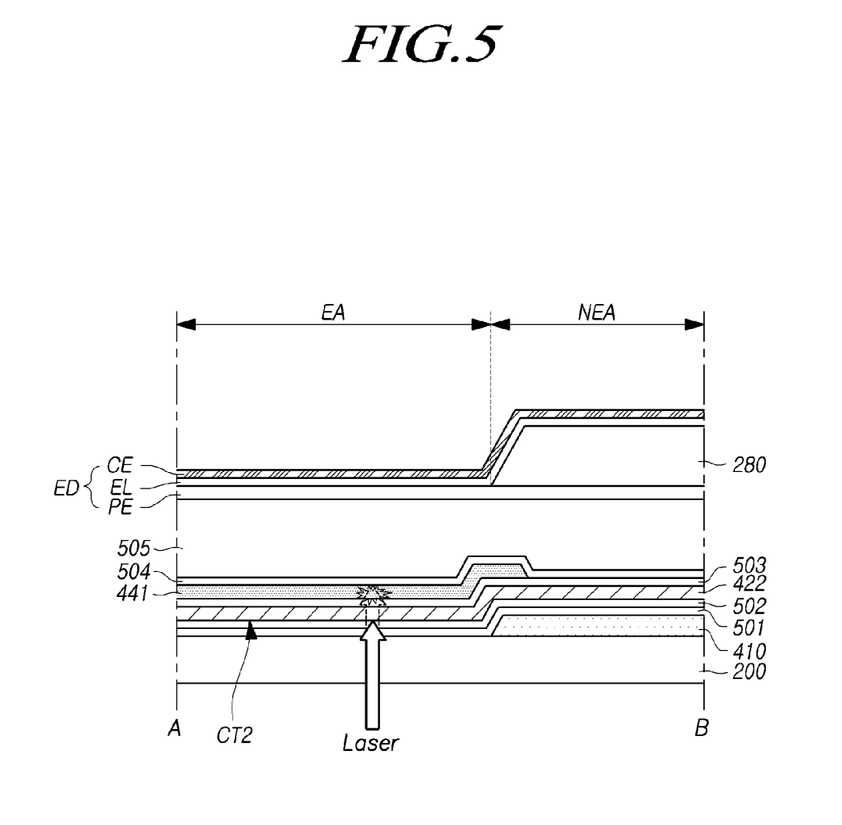
FIG. 5 is a cross-sectional view taken along line A-B of FIG. 4.

FIG. 5 is a cross-sectional view taken along line A-B of FIG. 4.

Referring to FIG. 5, the light blocking layer 410 may be disposed over the substrate 200.

First and second insulation films 501 and 502 may be sequentially stacked over the light blocking layer 410. The first and second insulation films 501 and 502 may include an inorganic insulating material.

The second portion 422 of the signal line 220 may be disposed over the second insulation film 502.

As illustrated in FIG. 5, a portion of the second portion 422 of the signal line 220 may not overlap with the light blocking layer 410 disposed under the signal line 220. In other words, only the substrate 200 and the plurality of insulation films 501 and 502 may be disposed under a portion of the second portion 422 of the signal line 220.

A third insulation film 503 may be disposed over the second portion 422 of the signal line 220. The third insulation film 503 may include an inorganic insulating material.

The first protection pattern 441 may be disposed over the third insulation film 503.

As illustrated in FIG. 5, a portion of the first protection pattern 441 may overlap with a portion of the light blocking layer 410 and the second portion 422 of the signal line 220, at least a part of another portion of the first protection pattern 441 may overlap with the second portion 422 of the signal line 220 but may not overlap with the light blocking layer 410.

Although FIG. 5 illustrates a structure in which a portion of the first protection pattern 441 overlaps with a portion of the light blocking layer 410, aspects of the present disclosure are not limited thereto. For example, at least a part of the first protection pattern 441 may not overlap with the light blocking layer 410.

At least a portion of the area where at least a part of the first protection pattern 441 does not overlap with the light blocking layer 410 may correspond to the area where at least a part of the second portion 422 of the signal line 220 does not overlap with the light blocking layer 410.

At least a part of the area where the second portion 422 of the signal line 220 and the first protection pattern 411 do not overlap with the light blocking layer 410 may correspond to the second cutting point CT2 of FIG. 3.

A fourth insulation film 504 may be disposed over the first protection pattern 441. The fourth insulation film 504 may include an inorganic insulating material.

A fifth insulation film 505 may be disposed over the fourth insulation film 504. The fifth insulation film 505 may include an organic insulation material.

The pixel electrode PE may be disposed over the fifth insulation film 505.

A bank 280 may be disposed over the pixel electrode PE.

A light emitting layer EL and a common electrode CE may be sequentially stacked over the bank 280. The common electrode CE may include a transparent conductive material.

As illustrated in FIG. 5, to repair the signal line 220, a laser beam may be radiated to the second cutting point CT2 in a direction from the rear surface of the substrate 200 to the signal line 220.

Since the light blocking layer 410 is not disposed in the area corresponding to the second cutting point CT2, the laser beam may be radiated to the second portion 422 of the signal line 220.

If irradiated with the laser beam, the second portion 422 of the signal line 220 at the second cutting point CT2 may be disconnected.

Further, the first protection pattern 441 may block the remaining laser beam radiated to the second cutting point CT2 from reaching the pixel electrode PE or common electrode CE disposed over the signal line 220.

Accordingly, even after the signal line 220 is repaired, the pixel electrode PE and the common electrode CE may not be damaged.

Referring to FIG. 5, at least a part of at least one first protection pattern 441 disposed in the subpixel SP may overlap with a portion of the emission area EA.

For example, when the first protection pattern 441 does not exist, the pixel electrode PE or common electrode CE disposed over the signal line 220 may be damaged by the laser beam during the repair of the signal line 220. However, as shown in FIG. 5, the light emitting element ED may be protected from the laser beam by the first protection pattern 441 overlapping with at least a part of the first signal line 220.

Although FIGS. 4 and 5 illustrate a structure in which the first protection pattern 441 and the second protection pattern 442 are disposed in the emission area EA, the structure of the display device 100 according to aspects of the present disclosure is not limited thereto. For example, at least a part of at least one protection pattern 440 in the display device 100 may be disposed to overlap with the non-emission area NEA.

For convenience of description, the description in connection with FIG. 4 focuses primarily over the stacked structure at the second cutting point CT2. However, in the display device 100 according to aspects of the present disclosure, the stacked structures at the first cutting point CT1, the third cutting point CT3, and the fourth cutting point CT4 may correspond to the stacked structure at the second cutting point CT2.

Figure 6:
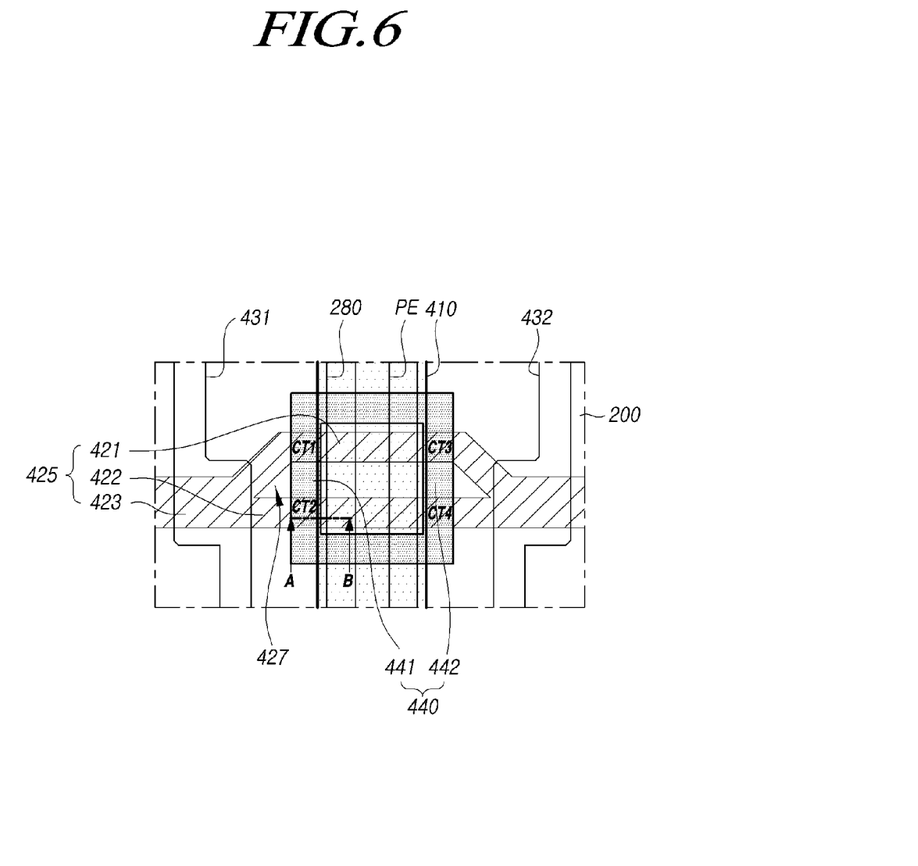
FIG. 6 is a view illustrating a partial structure of a display device including a protection pattern having a different shape from that of the protection pattern of FIG. 4, according to aspects of the present disclosure.

FIG. 6 is a view illustrating a partial structure of a display device including a protection pattern having a different shape from that of the protection pattern of FIG. 4, according to aspects of the present disclosure.

Substantially the same configurations and effects as those described above are not repeatedly described below. In the following description, the same reference numbers may be used to denote the same elements or components as those described in the above aspects.

Referring to FIG. 6, a display device 100 according to aspects of the present disclosure includes at least one protection pattern 440 overlapping with at least a part of at least one signal line 220.

As illustrated in FIG. 6, the protection pattern 440 may be shaped as a single closed loop.

A portion of the protection pattern 440 may overlap with a portion of the first portion 421 and a portion of the second portion 422 of the signal line 220.

At least a part of the area where the protection pattern 440 and the first portion 421 of the signal line 220 overlap with each other and at least a part of the area where the protection pattern 440 and the second portion 422 of the signal line 220 overlap with each other may be cutting points which are to be irradiated with a laser beam to repair the signal line 220.

Although FIG. 6 illustrates an example in which the protection pattern 440 has a single closed loop shape, the shape of the protection pattern 440 according to aspects of the present disclosure is not limited thereto, and the protection pattern 440 may have an open loop shape.

As described above, at least a part of the bank 280 does not overlap with at least a portion of the protection pattern 440, so that the protection pattern 440 may overlap the emission area EA.

In other words, as at least some of the cutting points CT1, CT2, CT3, and CT4 irradiated with the laser beam to repair the signal line 220 are formed to overlap with the emission area EA, the aperture ratio of the display device 100 may be enhanced.

This is described below with reference to FIG. 7.

Figure 7:
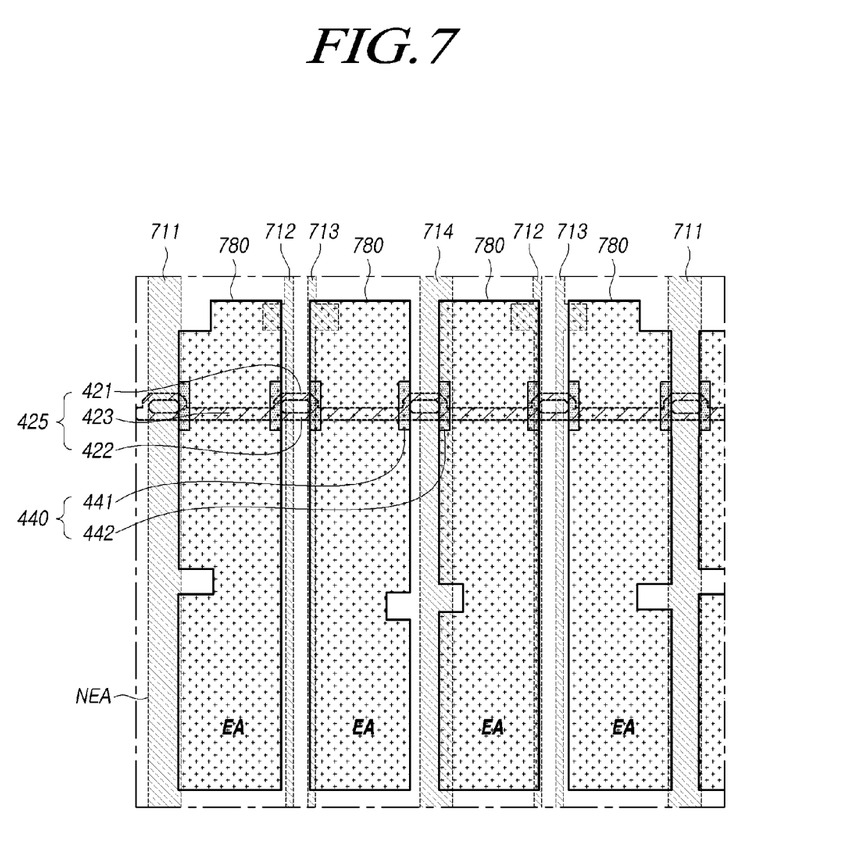
FIG. 7 is a view illustrating a portion of a display area of a display device according to aspects of the present disclosure.

FIG. 7 is a view illustrating a portion of a display area of a display device according to aspects of the present disclosure.

Referring to FIG. 7, a display device according to a comparative example may include a plurality of signal lines 220, 711, 712, 713, and 714, at least one protection pattern 440, and a bank 780.

Each of the first signal line 711, the second signal line 712, the third signal line 713, and the fourth signal line 714 may extend in a direction crossing the signal line 220 including the branched portion 425.

The first signal line 711 may be a driving voltage line, the second and third signal lines 712 and 713 may be data lines, and the fourth signal line 714 may be a reference voltage line. However, the types of the signal lines according to aspects of the present disclosure are not limited thereto.

At least a part of one branched portion 425 of the signal line 220 may overlap with at least one signal line among the first to fourth signal lines 711, 712, 713, and 714.

At least a part of the branched portion 425 of the signal line 220 may overlap the bank 780. In other words, the branched portion 425 of the signal line 220 may overlap with the non-emission area NEA.

Although not shown in the drawings, a plurality of transistors including a driving transistor and a storage capacitor may be disposed in the emission area EA.

Referring to FIG. 7, the display device 100 according to aspects of the present disclosure may include at least a part of a protection pattern 440 overlapping with a portion of the branched portion 425 of the signal line 220.

The protection pattern 440 may include a first protection pattern 441 and a second protection pattern 442 spaced apart from each other.

At least one of the plurality of first protection patterns 441 and the plurality of second protection patterns 442 may be disposed to overlap with at least a part of the emission area EA.

In other words, a portion of the branched portion 425 of the signal line 220 overlaps with the emission area EA, and at least one of the plurality of first and second protection patterns 441 and 442 overlaps with the branched portion 425 of the signal line 220 in the emission area EA, so that the aperture ratio of the display device 100 may be enhanced.

Even when a laser beam is radiated to the branched portion 425 during the process for repairing the signal line 220, the pixel electrode PE and the common electrode CE may be prevented from damaged by the protection pattern 440.

Further, since the laser beam is blocked from reaching the common electrode CE by the protection pattern 440, the bank 280 does not need to exist under the common electrode CE.

In other words, since the display device 100 according to aspects of the present disclosure includes the protection pattern 440 at a position corresponding to the cutting point, the cutting point existing for repairing the signal line 220 may be present in the emission area EA so that it is possible to increase the emission area EA.

The display device 100 according to aspects of the present disclosure includes at least one protection pattern 440 between the signal line 220 and the light emitting element ED, thereby enhancing reliability of the process of repairing the signal line 220 while enhancing the aperture ratio of the display device 100.

Further, the protection pattern 440 may serve to reduce parasitic capacitance between the signal line 220 and the pixel electrode PE.

This is described below with reference to FIG. 8.

Figure 8:
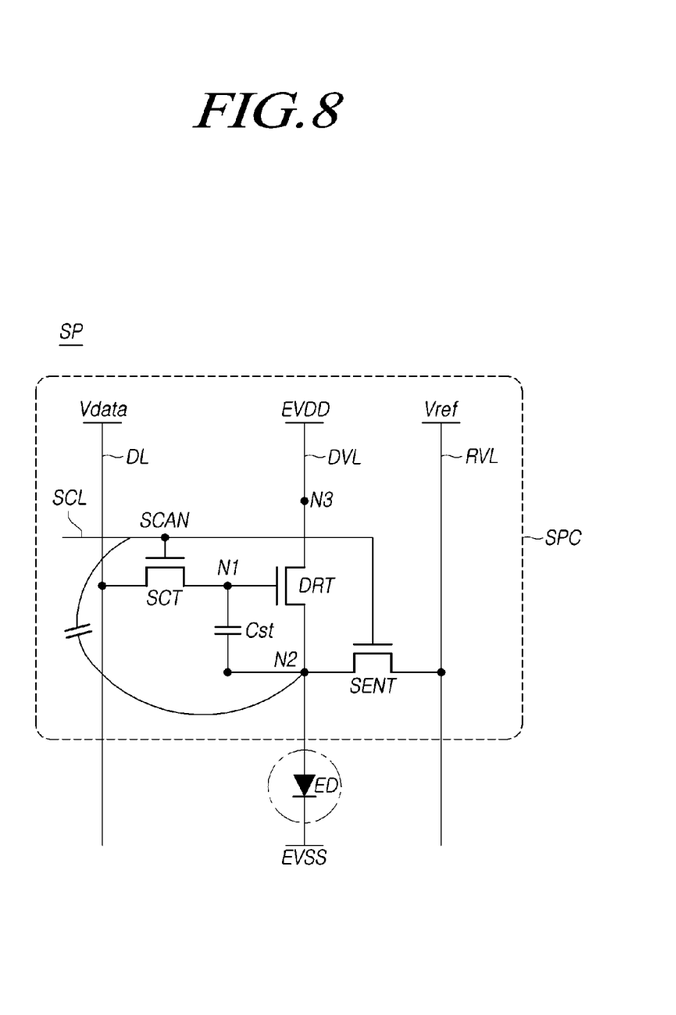
FIG. 8 is a circuit diagram illustrating parasitic capacitance occurring between a signal line and a pixel electrode.

FIG. 8 is a circuit diagram illustrating parasitic capacitance occurring between a signal line and a pixel electrode.

Referring to FIG. 8, in one subpixel SP, a parasitic capacitance may be generated between the source node of the driving transistor DRT and the scan line SCL.

In other words, a parasitic capacitance may occur between the signal line 220 and the pixel electrode PE in FIGS. 4 and 6.

As shown in FIGS. 4, 5, and 6, a floating protection pattern 440 is disposed between the signal line 220 and the pixel electrode PE, reducing the parasitic capacitance between the signal line 220 and the pixel electrode PE.

According to aspects of the present disclosure, there may be provided a display panel and display device capable of preventing damage to the electrodes of a light emitting element due to the laser beam upon repairing a signal line by disposing at least one protection pattern between the separated portion of the signal line and the light emitting element.

According to aspects of the present disclosure, there may be provided a display panel and display device having a structure capable of increasing the emission area by disposing the separated portion of a signal line, which is a component for repair, in the emission area through at least one protection pattern.

According to aspects of the present disclosure, there may be provided a display panel and display device having a structure capable of reducing parasitic capacitance between a signal line and a pixel electrode while enhancing driving reliability by preventing or blocking a parasitic capacitance between the signal line and the pixel electrode by disposing a floated protection pattern between pixel electrodes.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based over the following claims, and all technical ideas within the scope of equivalents thereof should be construed as being included within the scope of the present disclosure.

What is claimed is:

1. A display device, comprising:
a substrate;
a light blocking layer disposed over the substrate;
a signal line disposed over the substrate, overlapping with a portion of the light blocking layer, and having at least one branched portion;
at least one protection pattern overlapping with a portion of the branched portion of the signal line;
a pixel electrode disposed over the protection pattern;
a light emitting layer disposed over the pixel electrode; and
a common electrode disposed over the light emitting layer,
wherein at least a part of the branched portion of the signal line includes an area not overlapping with the light blocking layer, and
wherein, in the area not overlapping with the light blocking layer, at least a part of the branched portion overlaps with the protection pattern.

2. The display device of claim 1, wherein the signal line includes a first portion and a second portion separated through a hole, and
wherein the signal line includes a third portion where two opposite ends of the first portion and the second portion are integrally formed with each other.

3. The display device of claim 2, wherein at least a part of the protection pattern overlaps with a portion of the first portion and a portion of the second portion.

4. The display device of claim 3, wherein, in the area where at least a part of the branched portion does not overlap with the light blocking layer, an area where at least a part of the first portion and the second portion overlap with the protection pattern is a cutting point of the signal line.

5. The display device of claim 4, wherein, when the cutting point is irradiated with a laser beam, the signal line is in a disconnected state at the cutting point.

6. The display device of claim 3, wherein the protection pattern includes a first protection pattern and a second protection pattern spaced apart from each other, and
wherein at least a part of the first protection pattern and the second protection pattern overlap with a separated portion of the signal line.

7. The display device of claim 6, wherein the first protection pattern and the second protection pattern respectively overlap with a portion of the first portion and a portion of the second portion.

8. The display device of claim 6, wherein the first protection pattern and the second protection pattern respectively overlap with at least a part of different pixel electrodes.

9. The display device of claim 3, wherein at least one protection pattern is shaped as a single closed loop or an open loop.

10. The display device of claim 1, wherein at least a part of the protection pattern overlaps with a portion of the pixel electrode and a portion of the common electrode.

11. The display device of claim 1, wherein the substrate is divided into an emission area and a non-emission area surrounding the emission area, and
wherein at least one protection pattern is disposed in the emission area.

12. The display device of claim 1, further comprising a bank overlapping with a portion of an upper surface of the pixel electrode, and
wherein at least one protection pattern does not overlap with the bank.

13. The display device of claim 1, further comprising at least one transistor disposed over the substrate,
wherein the transistor includes:
an active layer disposed over the substrate;
a gate electrode disposed over the active layer; and
a source electrode and a drain electrode disposed over the gate electrode, and
wherein the protection pattern is disposed over a same layer as the source electrode and the drain electrode.

14. The display device of claim 1, wherein the protection pattern is a floating pattern.

15. A display panel, comprising:
a substrate including an emission area and a non-emission area surrounding the emission area;
a signal line disposed over the substrate, overlapping with a portion of the light blocking layer, and having at least one branched portion;
at least one protection pattern overlapping with a portion of the branched portion of the signal line;
a pixel electrode disposed over the protection pattern;
a light emitting layer disposed over the pixel electrode; and
a common electrode disposed over the light emitting layer,
wherein the at least one protection pattern is disposed in the emission area.

16. The display panel of claim 15, wherein the signal line includes a first portion and a second portion separated through a hole and a third portion where two opposite ends of the first portion and the second portion are integrally formed with each other, and
wherein at least a part of the protection pattern overlaps with a portion of the first portion and a portion of the second portion.

17. The display panel of claim 16, further comprising a light blocking layer disposed between the substrate and the signal line, wherein at least a part of the branched portion of the signal line includes an area not overlapping with the light blocking layer, and wherein, in the area not overlapping with the light blocking layer, at least a part of the branched portion overlaps with the protection pattern, and an area where the first portion and at least a part of the second portion and the protection pattern overlap with one another is a cutting point of the signal line.

18. The display panel of claim 15, wherein, in the emission area, the protection pattern is disposed over the branched portion, the pixel electrode is disposed over the protection pattern, the light emitting layer is disposed over the pixel electrode, and a common electrode is disposed over the light emitting layer, wherein the protection pattern includes a first protection pattern and a second protection pattern spaced apart from each other, wherein the first protection pattern and the second protection pattern overlap with at least a part of a separated portion, and wherein the first protection pattern and the second protection pattern, respectively, overlap with at least a part of different pixel electrodes.

19. The display panel of claim 15, wherein at least one protection pattern is shaped as a single closed loop or an open loop.

20. The display panel of claim 15, further comprising a driving transistor disposed over the substrate and electrically connected with the pixel electrode, wherein at least a part of the driving transistor overlaps with the emission area.

* * * * *